United States Patent [19]

Buerger et al.

[11] 4,163,212

[45] Jul. 31, 1979

[54] PATTERN RECOGNITION SYSTEM

[75] Inventors: Walter R. Buerger, Torrance; Kenneth K. Dixon, San Pedro; Jacques F. Monier, Torrance, all of Calif.

[73] Assignee: Excellon Industries, Torrance, Calif.

[21] Appl. No.: 831,667

[22] Filed: Sep. 8, 1977

[51] Int. Cl.² ............................................. G06K 9/04
[52] U.S. Cl. .................. 340/146.3 H; 340/146.3 AC; 364/490; 364/515
[58] Field of Search ............. 340/146.3 H, 146.3 AC, 340/146.3 R, 146.3 AH; 364/449, 460, 463, 468, 490, 491, 515

[56] References Cited

U.S. PATENT DOCUMENTS

| | | | |
|---|---|---|---|
| 3,407,386 | 10/1968 | Spanjersberg | 340/146.3 H |
| 3,629,830 | 12/1971 | Scarrott et al. | 340/146.3 H |
| 3,898,617 | 8/1975 | Kashioka et al. | 340/146.3 H |
| 4,034,343 | 7/1977 | Wilmer | 340/146.3 H |

*Primary Examiner*—Leo H. Boudreau
*Attorney, Agent, or Firm*—Fulwider, Patton, Rieber, Lee & Utecht

[57] ABSTRACT

A method and related apparatus for finding center lines or center points of distinguishable areas in a scanned field, such as the field of view of an optical scanning device in which is positioned an integrated-circuit chip. The invention is disclosed in the form of circuitry for analyzing a serial digital data stream representative of the image of the scanned field, and for determining the positions of center lines of center points of distinguishable areas in the field falling within a selected size range. The circuitry includes separate sections for analyzing the scanned image in order to detect center lines with respect to four separate scanning directions, the outputs of these sections being synchronized with each other, although delayed from the original serial data stream, and being representative of center lines of areas falling within the selected size range. The outputs of the four separate sections may be logically combined in any desired manner to produce a serial output signal indicative of center points of areas falling within the selected size range. Selected center points may then be used in conjunction with a wire bonding machine to provide information indicative of the position and orientation of the chip.

33 Claims, 18 Drawing Figures

PATTERN RECOGNITION SYSTEM

BACKGROUND OF THE INVENTION

The present invention relates generally to pattern recognition systems, and, more particularly, relates to a pattern recognition system for locating the geometric center lines or center points of distinguishable areas on a generally planar surface. The invention has many areas of possible application, but is described in the specific context of a system for locating bonding pads on semiconductor circuit (IC) chips. An IC chip is an interconnected array of active and passive electrical elements formed on a single semiconductor substrate, and capable of performing at least one electronic circuit function. The necessary electrical connections between IC chips in any arrangement of microcircuitry are made by external wire connections to terminal points taking the form of relatively large metallic bonding pads formed on each chip substrate. For any chip of a particular type or design, the bonding pads are located uniformly on the chip to a fairly high degree of precision. However, it is essential to be able to determine the position and orientation of the chip, and therefore the positions of the bonding pads with respect to a bonding machine, in order to bond conducting wires to them. It is also useful to be able to determine the position and orientation of the chip for other purposes, such as assembly or testing of chips.

The attachment of bonding wire to bonding pads on IC chips has, until recently, been a manual operation, performed by an operator using a wire bonding machine which includes a high-power microscope and manual controls allowing movement of the chip with respect to a bonding tool. Semi-automatic wire bonding machines have become available, and these perform the required bonding operations in an automatic pre-programmed sequence, but still require operator intervention in order to position each chip precisely at the start of the sequence. In other words, the position and orientation of each chip is first determined by the operator, then the semi-automatic machine utilizes this positional information to perform the bonding operation.

In another assembly operation in the fabrication of microelectronic circuitry, a chip assembly machine is utilized to pick up chips sequentially from an assembly station, and to place them in predetermined positions on a substrate. This machine also operates semi-automatically, but requires the chips to be properly aligned and oriented at the input station. Again, then, there is a need for some means for automatically determining the position and orientation of the chips.

There are other operations in the fabrication and testing of microcircuitry components which could also usefully employ some means for locating the bonding pads on IC chips. By way of further example, chips of various types may have to be sorted, and they can usually be reliably identified by their particular patterns of bonding pads. Another application is in the area of chip testing, wherein test probes must be placed in contact with various bonding pads. Again, if the bonding pads could be accurately and readily located without operator intervention, testing procedures could be substantially accelerated.

Accordingly, it will be appreciated that the fabrication of microcircuitry has a number of related needs requiring the detection and location of distinguishable areas on an essentially two-dimensional surface. The present invention satisfies these needs, and can also be usefully employed in many other applications involving the accurate location of distinguishable areas in a field of interest. For example, in any automated manufacturing process in which parts are to be coupled together, manual intervention is often required to orient and position the parts. Use of the present invention in such cases can result in complete automation of the assembly process.

SUMMARY OF THE INVENTION

The present invention resides in a method and apparatus for locating the centers of distinguishable areas in a field of interest. In general, the areas will be distinguishable because of optical or reflective characteristics different from those of the background or remaining area of the field of interest. The distinguishable areas may be squares, circles, rectangles, or irregularly shaped "blobs". "Blob" is clearly not a technical term, but it conveys to most people the meaning intended, i.e., a continuous area with substantially no holes, openings, or elongate extensions. Although the invention can also be successfully applied to the location of centers of blobs having attached elongate "tails", or relatively small holes or openings, it has no real significance, in the form disclosed herein, when applied to the detection of, for example, annular or nearly annular areas.

In order to describe the invention in its simplest and broadest terms, it is necessary to consider that the field of interest containing the distinguishable areas or blobs has been reduced to a physical form in which the blob can be readily distinguished from the remaining background area of the field of interest. The physical form may be optical, which can be readily converted to electrical form. Conversion of an optical image to an electrical signal is a conventional process and will not be dwelled upon in this specification. The electrical signal representing the field of interest may be analagous to a video signal in television technology, and may take analog form, as in a conventional television receiver. However, the signal can be more conveniently handled in digital form, either comprising an array of electrical elements, each representing a discrete element of the field of interest, or comprising a sequential stream of data derived from the array of elements.

With the foregoing preamble in mind, it can be stated that the invention in its broadest sense is a method, and related apparatus, for manipulating the signals representative of a field of interest in such a manner as to determine a center line of a blob in the field of interest by locating the centers of parallel lines drawn across the blob in a first scanning direction. If the blob is, for example, a rectangle having one pair of sides parallel to this first scanning direction, it will be appreciated that the center line determined by the invention will be oriented perpendicular to the first scanning direction. The center point of a blob is determined in accordance with the invention by determining the center line as just described, and then by determining a second center line by finding the centers of parallel lines across the blob in a second scanning direction orthogonal with the first. Again, by way of example, it will be seen that a rectangular blob to which this process is applied will have center lines intersecting at right angles, and that the intersection point will be the required center point of the blob.

In accordance with a further aspect of the invention, center lines of the blob are also determined by finding the center points of lines drawn across the blob in third and fourth scanning directions which are orthogonal to each other, but are angularly displaced with respect to the first and second scanning directions. Use of the intersection of the center lines produced by scanning in the third and fourth directions can result in accurate location of the blob center in cases in which, because of the particular shape of a particular blob, scanning in the first and second directions does not produce an accurate result.

More specifically, the apparatus of the invention performs the aforedescribed type of analysis on a serial data stream representative of a scanned field of interest. The serial data stream is a stream of binary information in which each bit represents the binary state of one picture element of the scanned field. The field is scanned in a line-by-line or raster sequence, and the resulting data stream is then manipulated by the apparatus of the invention. Basically, and in general terms, the apparatus of the invention includes means for analyzing the data stream to determine center lines of blobs, having a particular binary state, in the field of interest, each center line being located with respect to a first scanning direction. The resultant center lines can be displayed on a display device, or utilized in a comparison or inspection process to determine whether the article being scanned conforms to appropriate standards. Preferably, as in the presently preferred embodiment of the invention, the apparatus also includes means for determining the center lines of the blobs with respect to a second scanning direction which is orthogonal with the first. Combining the sets of two center lines in a logical AND operation yields the center point of each distinguishable area or blob.

In some instances, the shape and orientation of the particular area to be located is such that the aforedescribed technique does not yield a true or clearly definable center point. To overcome this problem, means are also provided for locating the center lines of each blob with respect to third and fourth scanning directions which are angularly related to the first and second scanning directions. These center lines can also be combined in a logical AND operation, to yield the center points of the distinguishable areas or blobs.

Although it would be possible to obtain the center lines with respect to multiple scanning directions by repeatedly scanning the field of interest in different directions, such an implementation would be costly and impractical from an engineering standpoint. What is required is a technique for obtaining the center lines with respect to two, four or more scanning directions, given that the image of the field of interest is represented by a single binary data stream resulting from a scan in only one direction. In order to avoid confusion, the original scanning direction from which the serial data stream is derived will be referred to herein as the optical scanning direction. It will be appreciated, however, that the actual scanning process may be electronic rather than optical.

One possible technique for implementing the invention would be to store the serial data stream in a two-dimensional memory array, then to create two duplicate images of the array and to manipulate the duplicate images to obtain the required centerlines. For example, if the duplicate images were shifted in the first scanning direction with respect to each other, the images of corresponding blobs in the duplicate images would move out of registration, and could be constantly monitored to determine when each line of one duplicate image ceased to overlap with the corresponding line in the other duplicate image. The number of shifts necessary to reach this point would be indicative of the width of the blob image measured along that particular line, from which a center point of the line could be determined, and stored in another array. Combining the center points determined in this manner, would result in a center line with respect to the first scanning direction. The process could then be repeated in second and further scanning directions, and the center points of the blob images thereby obtained. Unfortunately, however, this type of implementation would be highly impractical in terms of memory and time requirements.

In the presently preferred embodiment of the invention, the serial data stream representing the image of the field of interest is processed essentially in real time. The only delay involved is imposed by the need to scan across the full extent of a detectable blob before it is possible to determine its center. Thus, the magnitude of the the inherent delay is determined by the maximum size of blobs to be detected by the system.

In the presently preferred embodiment of the invention, the serial data stream is simultaneously processed by four separate analysis sections, each relating to one of four scanning directions. The output of each analysis section is a serial data stream having the same format as the input data stream, i.e., presenting the data in the same sequence as the original optical scanning direction. Each output data stream, however, does not contain the entire images of the blobs, but contains data representative of the centerlines of the blobs with respect to one of the four scanning directions. For convenience, the four output data streams are equally displaced in time with respect to the input data stream, and may be logically combined in any desired manner, and utilized in a display device or in any apparatus which requires information representative of the center lines or center points of the blobs in the field of interest.

The first analysis section is referred to as the up/down scan analysis section, although it will be understood that the designation of the scan as being in an up/down direction is purely arbitrary. The up/down direction here corresponds to the original optical scanning direction, and scanning in this direction represents the simplest of the four types of scan analysis. Basically, the up/down scan analysis section includes means for accumulating a count of an unbroken string of bits in the data stream having a particular state, for example ones, and means for determining the center point of each of the unbroken strings and storing a signal representative of the position of the center point in an output data stream.

An important aspect of the invention is its ability to discriminate between blobs of different sizes. In particular, it is desirable to be able to eliminate from consideration blobs of a very small size, as well as blobs of a relatively large size. Accordingly, the up/down analysis section includes filter means for disregarding unbroken strings longer than a selected maximum magnitude or shorter than a selected minimum magnitude. The up/down analysis section also includes delay means for delaying the output stream in order to synchronize it with output streams from the other analysis sections.

The second analysis section is referred to as the right-/left analysis section, although it will be again appreciated that the directional terminology is arbitrary. In any event, the right/left scan direction is the one which is orthogonal to the original optical scanning direction. Because of the orthogonal relationship this analysis section includes not a single means for accumulating unbroken strings of the same binary state, but rather includes a plurality of such accumulators, there being an accumulator for each line or row in the right/left direction. As each bit of data enters the analysis section, the appropriate accumulator is either incremented or reset to zero, depending upon the state of the input data bit. Also included is another filter means for disregarding unbroken strings of data of the required state which do not fall within the preselected limits. Again, means are included for determining the center points of each unbroken string and for entering in an output stream a signal indicative of each center point. Delay means are also included to synchronize this output data stream with the other three in the system.

The remaining two scan analysis sections are referred to as the first and second 45° scan analysis sections, and these differ in structure only slightly, but very significantly, from the right/left scan analysis section. In the first 45° scan analysis section, there is provided an accumulator means for accumulating acount of unbroken strings of bits of a particular binary state, with respect to a 45° direction relative to the up/down and right/left directions. As each bit of input data comes into the analysis section, one of a plurality of accumulators representing the length of an unbroken string extending in a 45° direction from the current data bit is either incremented or reset to zero, depending upon the state of the input bit. The second 45° scan analysis section also has a plurality of accumulators, but these are arranged to accumulate the sizes of unbroken strings of data in the opposite 45° direction to that of the first 45° scan analysis section. Both 45° scan analysis sections also include filter means and means for inserting center point images in a data stream. All four analysis sections include means for ensuring that a portion of a blob at the edge of the scanned field is not considered to be contiguous with an unrelated portion at the opposite edge of the field. This mechanism operates not only for the up/down and right/left scans, but also for the two 45° scans.

The output data streams of the four analysis sections may be selectively combined as desired. For display purposes, a selected combination or combinations of the four output data streams may be stored in one or more memory arrays, while the original scanned image is stored in a separate array. The multiple arrays can then be scanned in parallel and the output signals therefrom selectively combined to produce a composite image which includes the original scanned image, together with points representative of center points or center lines of blobs.

The center information derived from the pattern recognition system can be utilized in a variety of ways, depending upon the apparatus to which it is applied. In the wire bonder application, it is necessary to obtain the coordinates of at least two reference points on the chips being processed. Although any convenient reference points could be used, the most convenient choice is to use two bonding pads which are closest to two selected corners of a substantially rectangular chip.

Accordingly, an additional processing step in the invention as it relates to wire bonding is to select, from the identified centers of bonding pads, two that are closest to two selected corners of the chip. The chip can always be conveniently aligned such that it is oriented within about 10° of the original optical scanning direction. Therefore, the required reference point bonding pads, in addition to being closest to the corners of the chip, are also closest to the corresponding corners of the scanned field. The apparatus of the invention as it is presently applied to the wire bonder application includes means for determining the coordinates of reference points closest to two selected corners of the scanned field.

It will be appreciated from the foregoing summary that the present invention represents an important advance in the field of pattern recognition, particularly as applied to the processing of semiconductor chips. The invention provides a novel technique for locating the centers of distinguishable areas, such as bonding pads on chips, so that a chip may be automatically positioned and oriented in a processing machine. Other aspects and advantages of present invention will become apparent from the following more detailed description, taken in conjunction with the accompanying drawings.

BRIEF DESCRIPTION OF THE DRAWINGS

FIG. 4b is a timing diagram showing the nature of clock pulses and a "no-data" signal generated during the scanning sequence shown in FIG. 4a;

DESCRIPTION OF THE PREFERRED EMBODIMENTS

Figure 1:
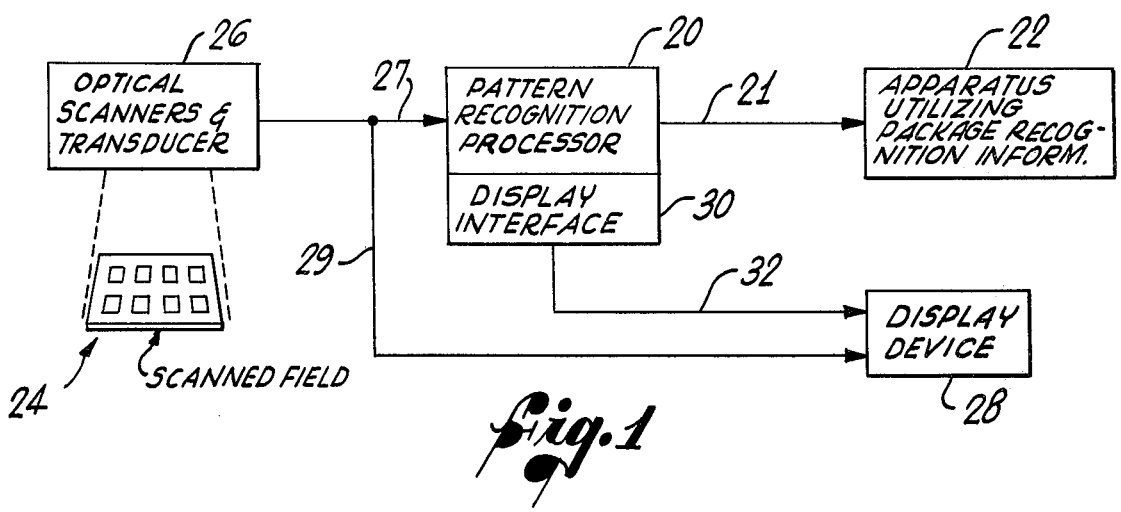
FIG. 1 is a block diagram illustrating how the pattern recognition apparatus of the invention may be connected to an optical scanner, a display device and apparatus utilizing pattern recognition information.

As shown in the drawings for purposes of illustration, the present invention relates to a pattern recognition system which may be usefully employed in manufacturing operations in which integrated semiconductor chips are to be processed. In the production and packaging of integrated circuit (IC) components, very small IC chips must be positioned and oriented with extreme accuracy before they can be processed by an otherwise automatic processing machine. Such a processing machine might be, for example, a wire bonder for bonding connecting wires from the terminals or bonding pads of IC chips to a lead frame, or might be an assembly machine that picks up and places chips in a predetermined pattern on a substrate. Other possible applications are integrated circuit testing machines and sorting machines. Prior to this invention, some degree of manual intervention was necessary in order to position each chip accurately before processing.

In accordance with the present invention, a pattern recognition processor, indicated by reference numeral 20 in FIG. 1, is coupled, as shown by line 21, to apparatus 22 which will utilize the pattern recognition information to position or orient a component or workpiece. The workpiece, such as an IC or semiconductor chip, is positioned in a scanned field, indicated at 24, adjacent to which is an optical scanner and transducer 26 which produces an electrical signal equivalent to the image of the scanned field, for transmission to the pattern recognition processor 20 over line 27, and to a display device 28, such as a cathode ray tube, over line 29. The pattern recognition processor 20 also communicates with the display device 28 through a display interface 30, and over line 32. More specifically, the pattern recognition processor 20 generates information representative of the center lines or center points of distinguishable areas, referred to herein as "blobs", and transmits this information to the display device 28 and to the apparatus 22, wherein it will be utilized to determine and possibly correct the position and orientation of the workpiece in the scanned field 24.

Center Finding Principles

Figure 2:
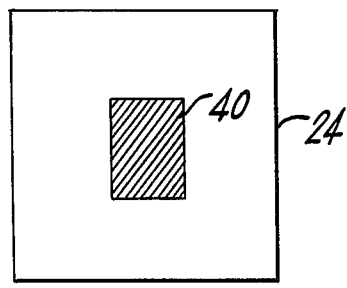
FIGS. 2a and 2b together illustrate in diagrammatic form the basic principles of the invention for determining center lines of distinguishable areas in a scanned field.

FIGS. 2a, 2b and 3a-3d illustrate the basic principle of the invention, wherein center lines or center points of distinguishable areas in the scanned field 24 are located. FIG. 2a shows a single rectangular blob 40 in the scanned field 24. In accordance with the method of the invention, a center line of the blob 40 is located by determining the center points of lines which are oriented in a selected scanning direction with respect to the field 24. It will be apparent from FIG. 2a that, if a number of horizontal lines were drawn across the field 24, the center points of those portions of the lines overlapping the blob 40 would define a vertical center line through the rectangular blob.

Figure 2B:
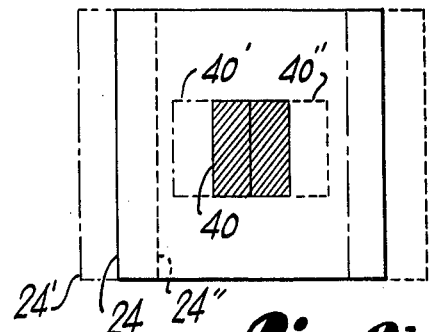

One technique for finding this sequence of center points is to produce two duplicate images of the field 24 and the blob 40, and to move these two duplicate images incrementally in opposite directions, away from the location of the original image. In FIG. 2b, the duplicate fields are shown as 24' and 24", respectively, and the duplicate blobs are shown as 40' and 40", respectively. It will be seen that, when the duplicate images have each been moved a distance equal to half the width of the blob 40, the duplicate images 40' and 40" representing the blob cease to overlap. If the duplicate images 40' and 41" are constantly monitored during this shifting process, for each discrete line of the blob, a series of center points can be obtained. In the case of a rectangle as shown, the result is, of course, a trivial one, but it will be understood that the technique is equally valid in cases involving squares or rectangles oriented at some angle to the shifting direction, as well as to blobs of different and irregular shapes.

Figure 3A:
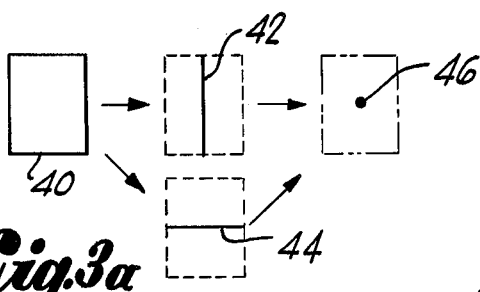
FIGS. 3a-3d illustrate in diagrammatic form the basic center finding technique of the invention as applied to a rectangle oriented at various angles to the scanning directions.

FIGS. 3a-3d further illustrate the basic center finding technique. In FIG. 3a, the rectangle 40 is processed in accordance with the technique described in connection with FIGS. 2a and 2b, to yield a vertical center line 42, and then processed in a similar fashion, but with a shifting or scanning direction orthogonal to the first, to yield a horizontal center line 44. Then, the vertical centerline 42 and horizontal centerline 44 are combined in a logical AND operation to yield a true center point 46.

Figure 3B:
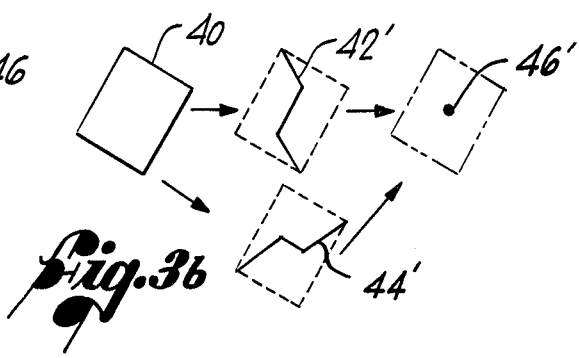

In FIG. 3b, the rectangular blob 40 is inclined at approximately 30° to the scanning direction, and it will be apparent that both the nominally vertical centerline 42 and the nominally horizontal centerline 44 are no longer continuous straight lines. However, the derived centerlines 42' and 44' can still be combined to produce a true center point 46', which is the same as the center point 46 of FIG. 3a.

Figure 3C:
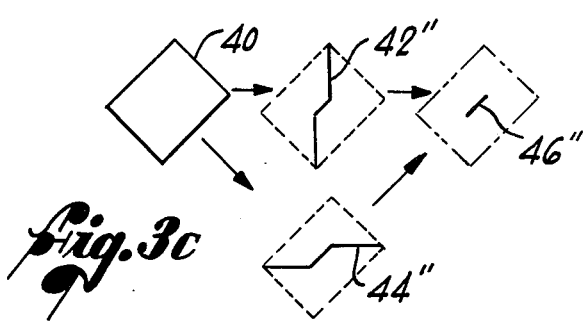
Figure 3D:
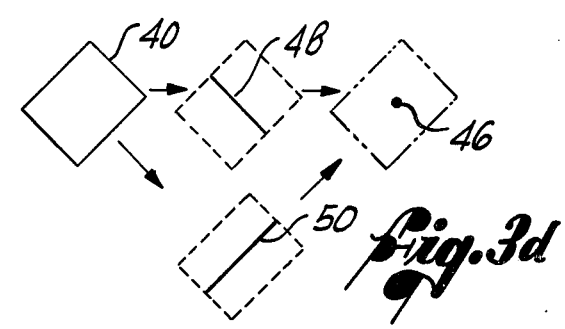

In FIG. 3c, the rectangle 40 is tilted at an angle of 45° to the scanning direction, and it will be seen that the resulting first center line 42" and second centerline 44" do not intersect at a center point, but rather produce an overlapping or blurred center 46". It can be seen from this simple example that the basic technique as described thus far does not always produce a true center point if the rectangular blob under consideration is oriented at close to 45° to the scanning direction. FIG. 3d again shows the rectangular blob 40 oriented at 45° to the horizontal and vertical directions, but shows the result of scanning at orthogonal directions which are themselves oriented at 45° to the horizontal and vertical directions. The results are true center lines 48 and 50, and a true center point 46.

The aforedescribed principles of center finding apply also to other than rectangular blobs, and, for most practical situations, the true centers of blobs can be located by utilizing either scanning in horizontal and vertical directions or scanning in orthogonally related 45° directions. Scanning in additional pairs of orthogonally related directions would provide for detection of center points of an even more diverse range of blob shapes and orientations, but it appears that two pairs of scanning directions are sufficient for many practical purposes.

Overview of the Pattern Recognition Processor

Figure 4A:
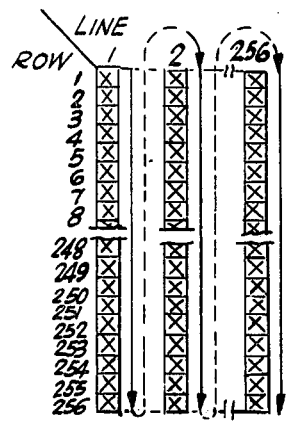
FIG. 4a illustrates in diagrammatic form the optical scanning sequence employed to generate an input data stream for the apparatus of the invention.

In the presently preferred embodiment of the invention, the optical scanner and transducer 26 (FIG. 1) provides a binary stream of data on line 27 to the pattern recognition processor 20. For convenience, the optical scanner and transducer 26 produce a signal representative of a matrix of 256×256 discrete picture elements. It will, of course, be appreciated that the numbers used throughout this discription are for illustrative purposes only. The scanned field 24 need not be square, and may be composed of any convenient number of picture elements. FIG. 4a is a fragmentary, diagrammatic representation of the picture elements in the scanned field 24. The signal produced on line 27 (FIG. 1) is a result of scanning along a first line in the field, then along a second line, and so forth until the last or 256th line is scanned. The direction of this original scan is referred to herein as the optical scanning direction, and is also arbitrarily designated as the up/down direction, as shown in FIG. 4a.

The optical scanner and transducer 26 are conventional and may be of any convenient design. In most practical systems, the stream of data produced on line 27 will not be a strictly continuous stream of data, but will include portions in which no data is contained, such as between the lines of the scan, as well as between the last line and the first line of the scan. These "no-data" periods are analogous to the horizontal and vertical retrace periods in a raster-scan television system. So that the pattern recognition processor 20 can distinguish true data signals on line 27, a "no-data" signal is provided to the pattern recognition processor. The form of the no-data signal is shown graphically at 60 in FIG. 4b in relation to the appearance of successive lines of data.

Figure 4B:
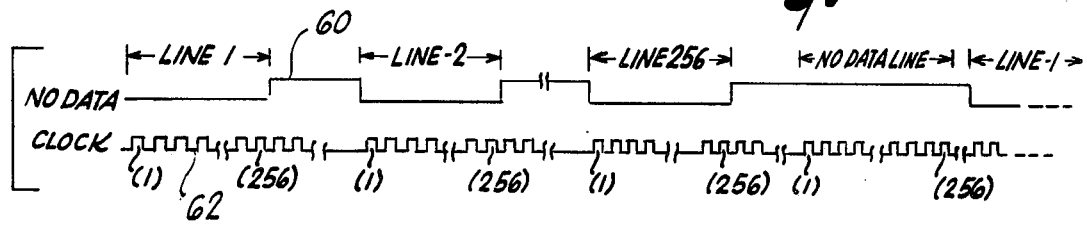

Also of importance to the pattern recognition processor 20 is a clock signal by means of which the processor can recognize each bit of data on the input line 27. The clock signals are generated by a conventional clock pulse generator (not shown), and are illustrated graphically at 62 in FIG. 4b. It will be easily seen that 256 clock pulses are required to clock each 256-bit line of input data. However, for reasons which will become apparent as this description proceeds, 258 clock pulses are provided for each line of data. As shown in FIG. 4b, two of these clock pulses occur during the "no-data" periods following each line. These additional clock pulses are necessitated because of the technique which is employed for scanning in the 45° directions. It will be seen from FIG. 4b that, after the last or 256th line, there is an additional line referred to as a "no-data" line during which another 258 clock pulses are generated. As will also become apparent, this no-data line of clock pulses is required to ensure that blobs ending in the last line of the optical scan are not considered to be contiguous with blobs beginning at a corresponding position on the first line.

Figure 5:
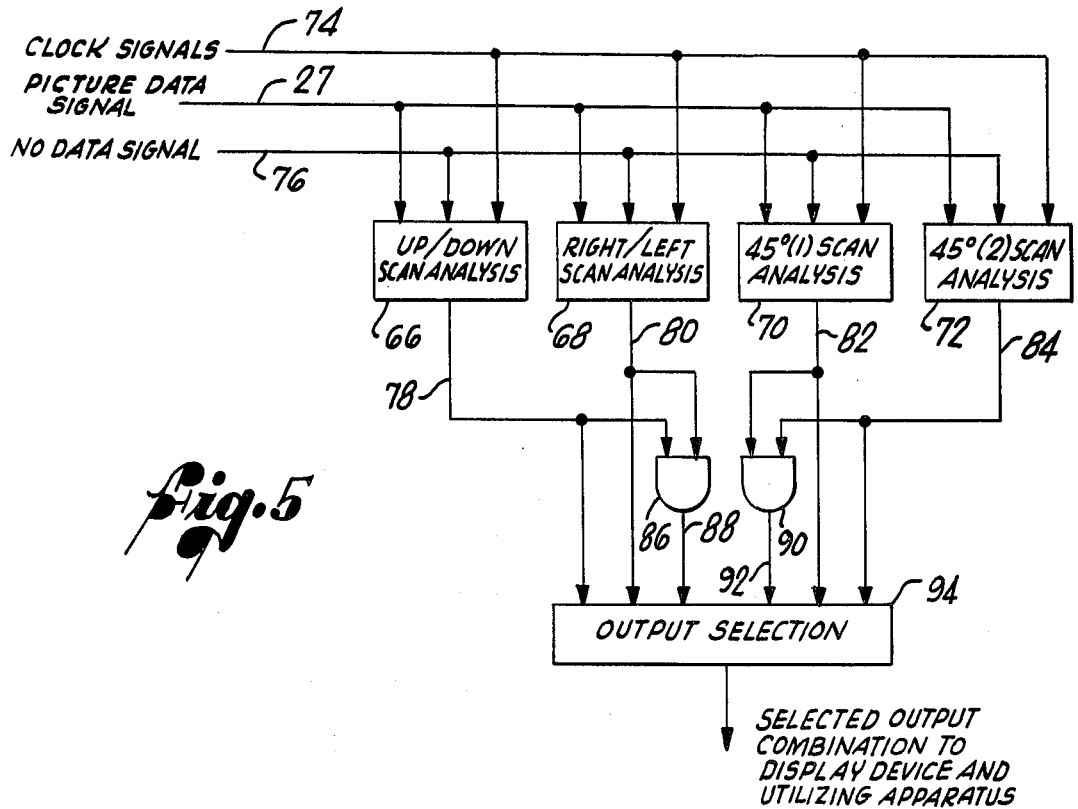
FIG. 5 is a block diagram of the pattern recognition processor of FIG. 1.

As shown in FIG. 5, the pattern recognition processor 20 comprises an up/down scan analysis section 66, a right/left scan analysis section 68, a first 45° scan analysis section 70, and a second 45° scan analysis section 72. Each of these four scan analysis sections is provided with a picture data signal on line 27 from the optical scanner and transducer 26 (FIG. 1), and is also provided with clock signals, on line 74 and a no-data signal on line 76, these being of the form illustrated in FIG. 4b, as discussed above.

The scan analysis sections 66, 68, 70 and 72 produce output data streams on lines 78, 80, 82, and 84, respectively. Each of these output signals is in the same scan sequence as the original optical scan described in relation to FIG. 4a, and indicates the position of center lines with respect to one of the four scanning directions. For example, the up/down scan analysis section 66 produces an output which indicates the center points of up/down scan lines as they overlap with blobs falling within a particular size range. If the scanned field included the rectanguler blob 40 shown in FIG. 2a, the output on line 78 from the up/down scan analysis section 66 would include binary signals representative of the image of the horizontal line 44 shown in FIG. 3a. Although any binary representation of the center lines may be employed, in the presently preferred embodiment picture elements representing the center lines appear as ones in a background of zeros.

In a similar fashion, the output of the right/left scan analysis section 68 on line 80 represents the center points obtained by scanning the field in a right/left sense and recording the center points of the portions of those scan lines which overlap blobs of a particular size range. Again, with reference to FIG. 3a, the vertical center line 42 of the rectangular blob 40 would appear in the output signal on line 80.

The outputs from the 45° scan analysis sections 70 and 72 represent the center lines of blobs falling within the choosen size range, as determined by scanning in the two 45° directions. The outputs of the up/down scan analysis section 66 and the right/left scan analysis section 68 may be combined in an AND gate 86 to produce center point signals on line 88 output from the AND gate. Similarly, the outputs of the two 45° scan analysis sections 70 and 72 may be logically combined in another AND gate 90 to produce center point signals on line 92. For convenience, the outputs of the scan analysis sections on lines 78, 80, 82 and 84, and the outputs of the AND gates 86 and 90 on lines 88 and 92 are all directed to output selection circuitry 94, which may take the form of a simple set of switches for selecting one or more combinations of the input signals for transmission to the display device 28 (FIG. 1), or to the apparatus 22 which will utilize the information.

As will shortly become apparent, there is an inherent time delay in each of the scan analysis sections 66, 68, 70 and 72. The magnitude of this delay is dependant upon the maximum size of the blobs which are to be analyzed. For example, if blobs of up to twenty picture elements in width are to be analyzed, there will be at least a ten-line delay (half of the width) in the right/left scan analysis section 68. However, once a maximum blob size has been determined for a particular application, it can be easily arranged that the total delays in each of the scan analysis sections are equal, so that the signals appearing on the output lines 78, 80, 82 and 84 may be merged and combined without any logical inconsistency due to timing differences.

Up/Down Scan Analysis

Figures 6, 6A:
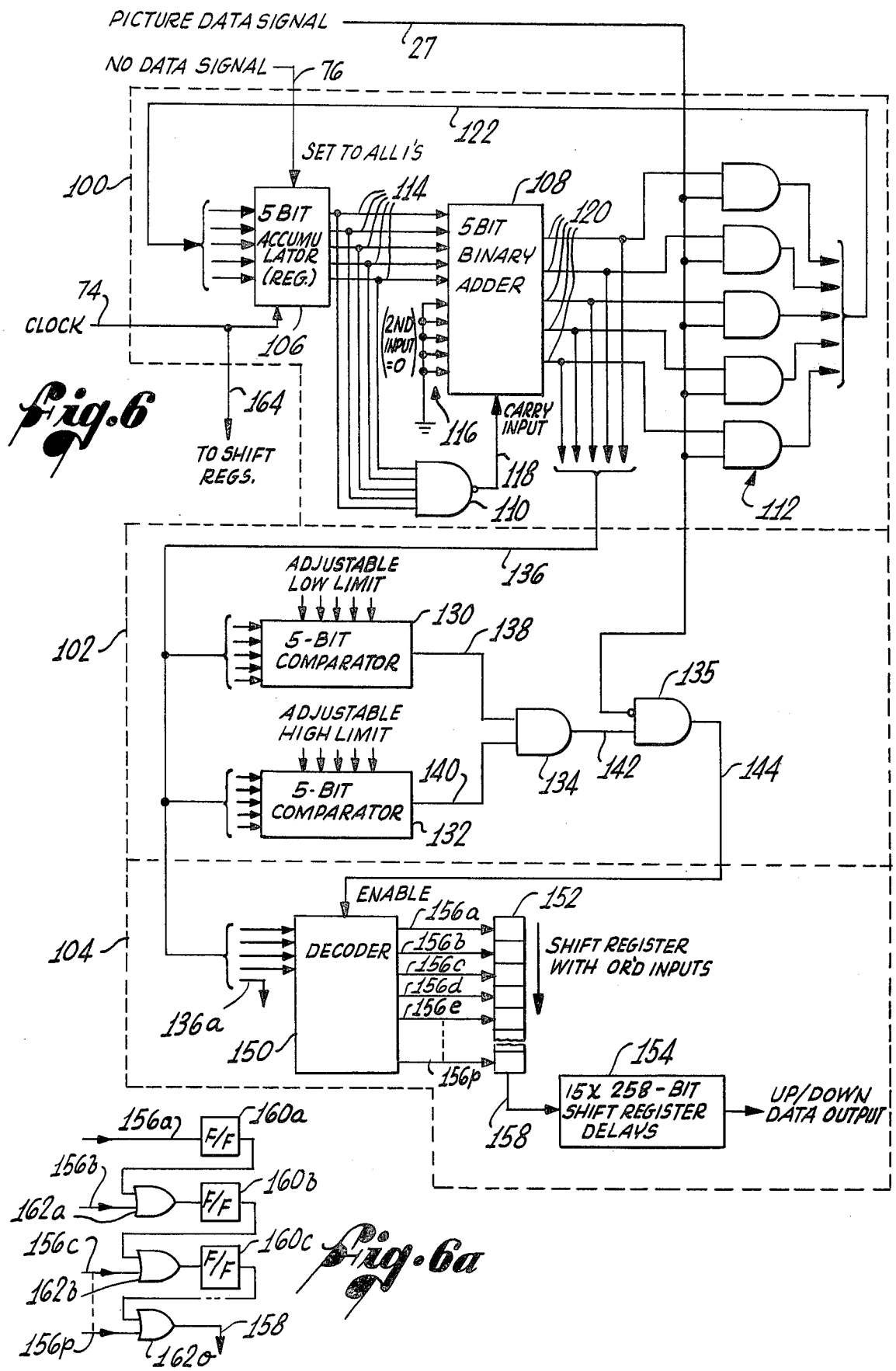
FIG. 6 is a simplified logic diagram of the up/down scan analysis section of FIG. 5.
FIG. 6a is a more detailed logic diagram of the shift register included in FIG. 6.

As shown in FIG. 6, the up/down scan analysis section 66 comprises an accumulator section 100, a filter section 102 and a center image storage section 104. The picture data signal is input to the accumulator section on line 27 and is processed to determine the length of unbroken strings of binary ones in the data signal. The accumulator section 100 comprises a five-bit register 106 which serves as the accumulator, a five-bit binary adder 108, a NAND gate 110 and five AND gates 112. The outputs from the accumulator register 106 are connected by line 114 to one input of the binary adder 108. The second input of the binary adder 108 is, as indicated at 116, connected to ground to provide a zero input. The binary adder 108 has a carry input, indicated at 118, which is normally used when the adder is combined with other adder circuits, to provide a carry signal from bits of lower significance. In this configuration, however, an input signal is provided to the carry input 118 from the output of the NAND gate 110, the inputs of which are five lines connected to the lines 114 from the accumulator register 106. It will be seen that, so long as at least one of the lines 114 is in the zero state, there will be a one output from the NAND gate 110, and therefore a carry input on line 118. The effect of this will be to add one to the binary number input on lines 114 in the binary adder 108. Thus, the binary adder 108 performs an incrementing function so long as the count in the accumulator is not at its full capacity, i.e. all ones. The output of the binary adder 108 is connected by five lines 120 to the five respective AND gates 112. Also input to the AND gates is the picture data signal on line 27. The output signals from the AND gates 112 are connected by line 122 as the inputs to the accumulator register 106.

When the current value of the picture data signal is a one, it will be seen that the AND gates 112 are enabled, and the output of the binary adder 108 is then gated back to the input of the accumulator register 106. However, if the current picture data signal input is a zero, the AND gates 112 are not enabled, and zero values are gated back along lines 122 to the input of the accumulator register 106. Clock signals on line 74 are applied to the accumulator register 106 to control this operation. So long as zeros continue to be received on the picture data signal line 27, the accumulator 106 will remain zeroed. When a first "one" appears on line 27, the accumulator will be incremented by one, and will be further incremented by one for each additional "one" signal appearing on line 27. When a zero appears on line 27 following a string of "ones", the accumulator 106 will be reset to zero.

The filter section 102 comprises two five-bit comparators 130 and 132 and two AND gates 134 and 135. One set of inputs to each of the comparators 130 and 132 is derived from the lines 120 output from the binary adder 108, and is transmitted over lines 136 to the comparators. The other set of inputs for comparator 130 is an adjustable low limit, and the other set of inputs for comparator 132 is an adjustable high limit, these adjustable limits representing the minimum and maximum sizes of blobs of interest in the scanned field. If a scanned line of a blob falls outside of these adjustable limits, it will not produce a center point in the output stream on line 78. If the five-bit value input on lines 136 to comparator 130 is above the adjustable low limit, a signal is generated on line 138 and applied as an input to AND gate 134. Similarly, if the five-bit digital value on lines 136 is below the adjustable high limit applied to comparator 132, a signal is generated on line 140 which is also connected as an input to AND gate 134.

The output of AND gate 134 is connected by line 142 as an input to AND gate 135, the other input of which is the inverted picture signal derived from line 27. As long as the input picture data signal on line 27 is a "one", AND gate 135 will be disabled and will produce no output. When the picture data signal is currently a zero, the AND gate 135 is enabled, and, if the current accumulator value derived from the binary adder 108 is between the adjustable low and high limits, a "one" is output from AND gate 135 on line 144. As now will be discussed, the output on line 144 is utilized in the center point image storage section 104 to store the center point of that portion of a scan line which overlaps the detected blob. An output will be supplied on line 144 from the AND gate 135 only for the first zero data signal following a string of "ones". If the data signal remains zero, on the second detected zero the accumulator 106 will have already been zeroed, so that the filter section 102 will receive on lines 136 a five-bit value which is out of limits, and no output will be generated on line 142 from the AND gate 134.

The center point image storage section 104 comprises a decoder 150, a shift register 152 and a set of shift register delays 154. The output from the binary adder 108 is also connected by lines 136 as an input to the decoder 150. More precisely, four of the five bits available on lines 136 are connected to the decoder 150. The least significant bit is discarded, as indicated at 136a, in an effective divide-by-two operation. Accordingly, the input to the decoder 150 is a digital value equal to one-half of the accumulated width of the current blob size. Since the output from the binary adder 108 is always one greater than the value stored in the accumulator 106, there is an automatic rounding step involved in dividing by two in this manner. In effect, the four-bit value input to the decoder 150 represents the "back-to-center" distance of the blob, i.e., it represents the distance measured from the current point in the optical scan, back to the center of the blob, along the line of the scan.

The line 144 output from the filter section 102 is connected as an enabling input to the decoder. The decoder is therefore only rendered operative when the edge of a blob is detected, and when the blob size falls within the predefined size limits. The decoder 150, having a four-bit binary input, has sixteen output lines, indicated as 156a, 156a–156p, only one of which is energized at any time, when the decoder is enabled, in accordance with the binary value input on lines 136. The shift register 152 has OR'd inputs, i.e., each time it is shifted, the value of each bit position is determined by a logical OR operation involving the value of the preceding bit position and a separate input value. The output lines from the decoder 156a–156p are input to the respective bit positions of the shift register 152, and the output of the shift register, on line 158, represents an image of the center points which is time delayed with respect to the original picture data signal by the number of bit positions in the shift register 152.

The shift register 152 is shown in more detail in FIG. 6a as comprising a plurality of flip-flops 160a, 160b, etc., only three of which are shown, and a plurality of OR gates 162a, 162b, etc. The output of the first flip-flop 160a is connected as an input to the first OR gate 162a, the output of which is connected as the input to the next flip-flop 160b, and so on. The first output from the decoder on line 156a is connected as an input to the first flip-flop 160a, the second output 156b is connected as an input to the OR gate 162a, the third output 156c is connected as an input to the second OR gate 162b, and so on, until the last output from the decoder on line 156p is connected as an input to the last OR gate 162o, the output of which is also the output of the shift register 152 on line 158.

It will be apparent, that with the aforedescribed arrangement, only fifteen flip-flops and fifteen OR gates, making up a 15'-bit shift register, are required. When all of the outputs on lines 156 from the decoder 150 are zero, the shift register 152 will produce continuously zero output on line 158. When a center point of a scan line passing through a blob is detected, it will be inserted into the shift register 150 at the appropriate point, and will appear on the output line from the shift register as a "one" in a stream of zeros. It will be apparent that the signal on line 158 is delayed by fifteen picture elements with respect to the picture data signal on line 27. The signal on line 158 is subjected to a further delay in the shift registers 154 before being output on line 78. The additional delay in registers 154 represents fifteen lines, each of 258 bits or picture elements, and, as will be seen, the additional delay is necessary in order to synchronize the output on line 78 with the outputs from the right/left scan analysis section 68 and the first and second 45 degree scan analysis sections 70 and 72 (FIG. 5).

The clock signals on line 74 are also connected, as shown at 164, to the shift register 152 and the shift registers 154, so that these registers are clocked at the same rate as the incoming picture data signal on line 27.

Detailed connection of these clocking signals to the shift registers have, however, been omitted for clarity of illustration.

All that remains to be described with regard to the up/down analysis section 66 is the operation of the no-data signal on line 76. As already described, at the end of each line of data, the no-data signal is generated, but these are two additional cycles of the clock signal on line 74 after the no-data signal becomes effective, i.e. becomes a "one". The no-data signal on line 76 is connected to the accumulator 106 in such a manner as to set all of the outputs of the accumulator to "ones". As has already been described, the all-one's condition of the accumulator 106 is detected by the NAND gate 110 and results in a zero carry input on line 118 to the binary adder 108, thereby preventing any further accumulation in the accumulator 106 until a subsequent zero is detected in the picture data signal on line 29. Accordingly, the effect of the no-data signal is to place the accumulator 106 in an overflow condition so that a portion of a blob on the lower edge of the scanned field will not be run together with a portion of another blob at the upper edge of the field. It should also be mentioned that, when the picture data signal becomes zero after an overflow condition, this will not result in the detection of a blob center, because the overflow value will be greater than the adjustable high limit, and no enabling signal will be generated on line 144 from the filter section 102.

Right/Left Scan Analysis

Figure 7:
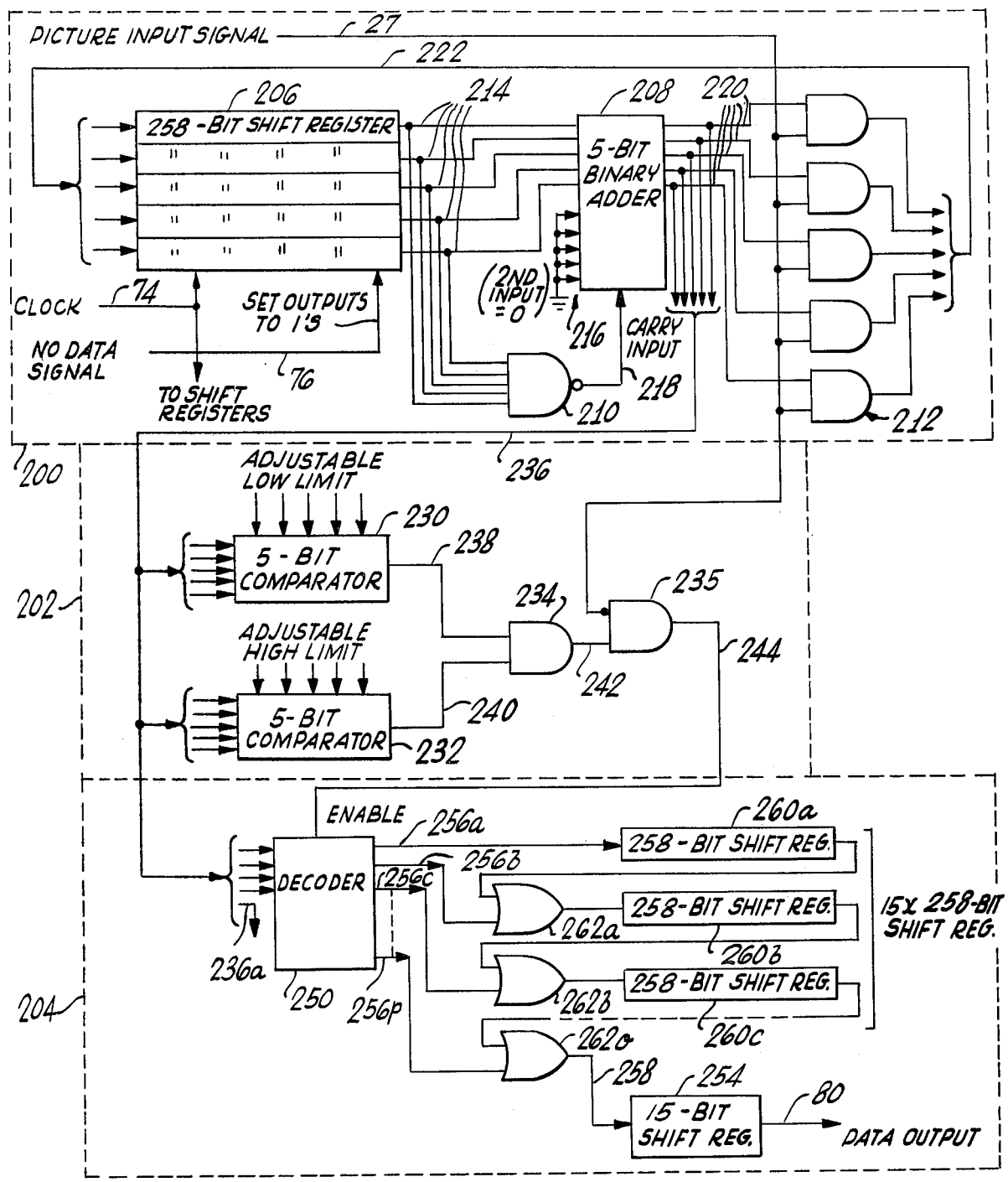
FIG. 7 is a simplified logic diagram of the right/left scan analysis section of FIG. 5.

As shown in FIG. 7 the right/left analysis section also comprises an accumulator section 200, a filter section 202, and a center point image storage section 204. Like the accumulator section 100, the accumulator section 200 comprises an accumulator 206, a five-bit binary adder 208, a NAND gate 210 and five AND gates 212. The accumulator 206 has five output lines 214 conveying information to one input of the binary adder 208, other input of which, indicated at 216, is held at zero by grounding.

The NAND gate 210 has an output connected over line 218 to the carry input of the binary adder 208, and the five output lines 220 from the binary adder are connected as inputs to the AND gates 212, the second inputs of which are derived from the picture signal on line 27. Again, the outputs of the AND gates 212 are connected by lines 222 as inputs to the accumulator 206.

Thus far, the description of the right/left accumulator section 220 exactly parallels the description of the up/down accumulator section 100. The only difference lies in the nature of the accumulator 206. Whereas the accumulator 106 was a simple 5-bit register, the accumulator 206 is comprised of five 258-bit shift registers. This difference arises because, in the up/down scan analysis, the scan direction was parallel to the original optical scan direction. In the right/left scan analysis, the scan direction is at 90° to the original optical scan direction. The accumulator 206 must provide a plurality of accumulators, one for each of the 256 row positions indicated in FIG. 4a. As a consequence of also performing the 45° scans, to be described later, an additional two shift register positions are required in each of the shift registers in the accumulator 206, making a total of 258 separate accumulators, two of which will be used to accumulate no useful information.

The function of the accumulator section 200 is identical with that of the accumulator section 100. The only difference is that resulting from the nature of accumulator 206. When a five-bit incremented value is clocked back to the accumulator 206 over lines 222, it is not retrieved for incrementing by the binary adder 208 until 258 picture elements or clock pulses have passed, i.e. until a complete line of data has been processed. It should be apparent, then, that each bit position of the five shift registers comprising the accumulator 206 makes up a 5-bit accumulator equivalent in function to the accumulator 106 in the up/down scan analysis section 66.

The filter section 202 is identical to the filter section 102. There are two five-bit comparators 230 and 232 supplied with one set of inputs over lines 236 from the binary adder 208, and supplied with, respectively, an adjustable low limit and an adjustable high limit. The outputs of the comparators 230 and 232 on lines 238 and 240 are supplied as inputs to AND gate 234, the output of which is supplied as an input to AND gate 235. The other input to AND gate 235 is an inverted picture input signal, i.e. the gate is enabled by a zero input signal. The output of AND gate 235 is then connected over line 244 as an enabling signal for the center point image storage section 204.

The center point image storage section 204 also has a decoder 250 with a 4-bit binary input derived from the four most significant bits on lines 236 from the binary adder 208. Likewise, there are sixteen output lines, indicated by 256l–256p from the decoder 250. The decoder outputs are connected to an arrangement of fifteen 258-bit shift registers 260a–260o, of which only the first two and the last one are shown. The first output from the decoder 250 on line 256a is connected as an input to the first shift register 260a, the output of which is connected as an input to the first OR gate 262a. The other input to the first OR gate 262a is the second decoder output on line 256b, and the output of the first OR gate 262a is connected as the input to the second shift register 260b, the output of which is connected to the second OR gate 262b, and so on. The output of the last shift register (not shown) is connected as in input to the last OR gate 262o, the other input of which is derived from the last decoder output on line 256p. The output of the last OR gate 262o on line 258 is transmitted to a 15-bit shift register 254 and thence to output line 80 from the right-/left data analysis section.

The substitution of the shift register 260a–260o for the simple shift register 152 is again necessitated by the fact that the direction of scanning is orthogonal to the original optical scanning direction. The output of the decoder 250 is indicative of "back-to-center" distances measured along a line at right angles to the optical scanning direction. Accordingly, to insert the center point images requires the arrangement of full-line shift registers as shown. Again, the 15-bit shift register 254 is necessitated only in order to synchronize the output signal on line 80 with the corresponding output signals from the other scan analysis sections.

The no-data signal on line 76 is applied to the accumulator 206 in such a manner as to set the outputs of the shift registers making up the accumulator to ones. This is essentially acquivalent to the operation of the no-data signal in the accumulator section 100 relating to up/-down scanning. The need for the no-data line indicated in FIG. 4b should now be apparent. After 256 lines of data have been scanned, the entire field has been scanned in the right/left sense, and it becomes necessary to reset all the accumulators before beginning a new scan of the field, so that blob images in the last line will not be run together with unrelated blob images in the first line.

Clock signals on line 74 are, of course, supplied to the shift registers making up the accumulator 206, as well as to shift registers 254 and 260a–260o in the center point image storage section 204.

45° Scan Analysis

Figure 8:
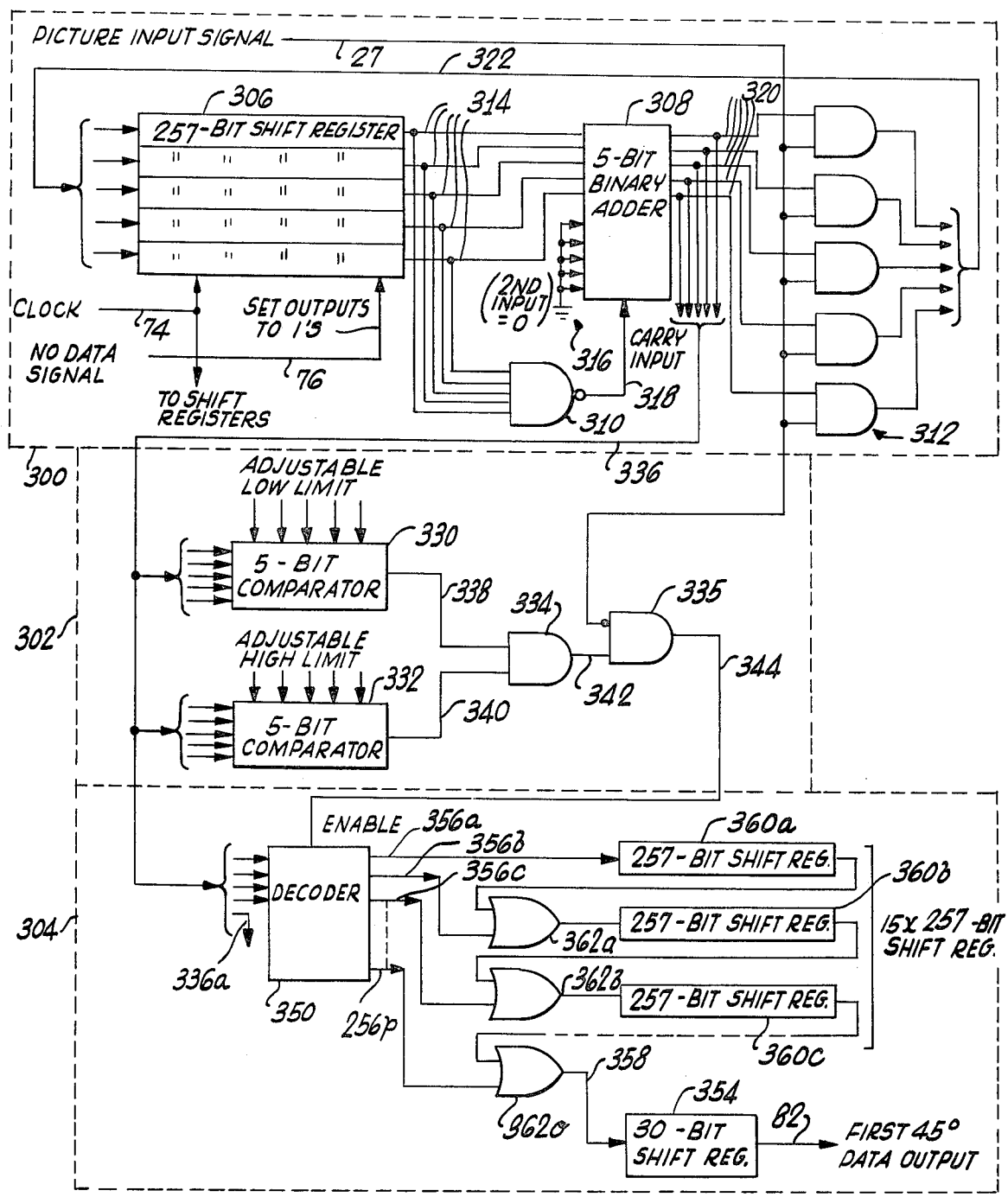
FIG. 8 is a simplified logic diagram of the first 45° scan analysis section of FIG. 5.
Figure 9:
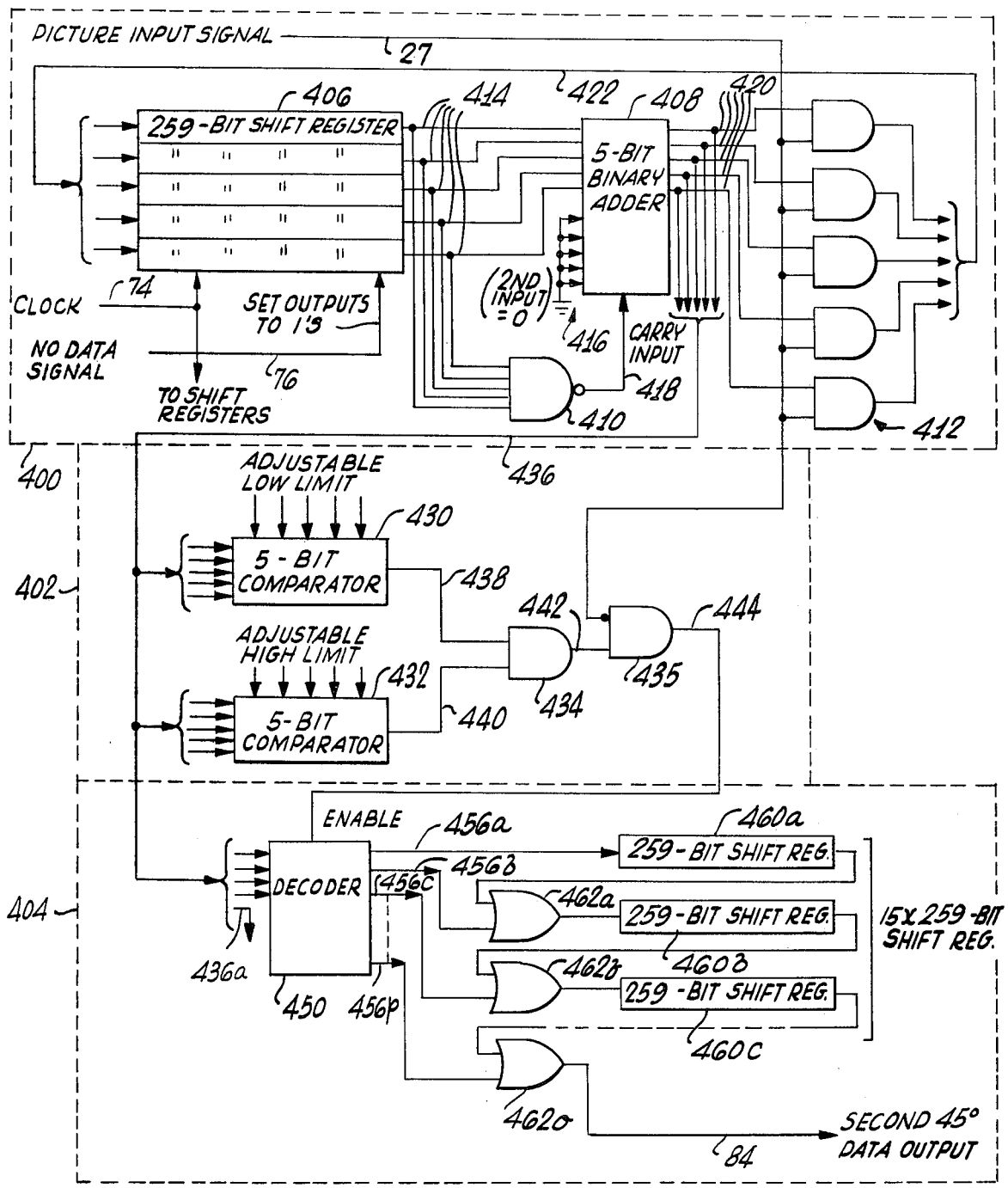
FIG. 9 is a simplified logic diagram of the second 45° scan analysis section of FIG. 5.

The analysis sections 70 and 72 for scanning in the 45° directions are illustrated in FIGS. 8 and 9, and it will be apparent that the hardware components in these figures are almost exactly equivalent to corresponding elements in FIG. 7. Accordingly, in FIGS. 7, 8 and 9 the reference numerals of corresponding elements have the same last two digits. In FIG. 7 the first digit 2 is used, in FIG. 8 the first digit is 3, and in FIG. 9 the first digit is 4. Numbering in FIGS. 7–9 also conforms closely with corresponding numbering in FIG. 6.

The essential differences in FIG. 8, as contrasted with FIG. 7, lie in the nature of the accumulator 306 and the shift registers 260a–260o. The shift registers comprising the accumulator 306 are 257-bit shift registers rather than 258-bit shift registers, and the shift registers 360a–360o are correspondingly 257 bits long rather than 258 bits. It will be recalled from FIG. 4b that 258 clocking pulses are provided for each line of data, two of these clocking pulses occurring during the "no-data" period. In the accumulator 206, the shift registers were 258 bits long, so that each of the 5-bit accumulators moving through the shift registers was always related to the same row position. For example, there would be a 5-bit accumulation relating to row #8 which would be passed to the binary adder 208 each time a picture element corresponding to row #8 was input on line 27.

In contrast, since the shift registers making up accumulator 306 have only 257 bits, it can be seen that each 5-bit accumulator will take one picture element time less to traverse the shift registers than it would in accumulator 206. Consequently, if a picture element in row #8 causes the incrementing of an accumulated value in one line, that accumulated value will come up for consideration again not in row #8 of the next line, but in row #7 of the next line. Stated another way, the use of a 257-bit shift register clocked by 258 pulses per line results in a one-row offset being applied to each successive line scanned in the accumulator section 300. It can be seen that the effect of this is to accumulate or scan in a direction 45° to the original optical scanning direction. Since there are no-data signals at the end of each line and there is a no-data line following the last rear line of data, the effect of the no data signal on line 76 will be to zero out each accumulator when the edge of the scanned field is reached, whether it be the bottom edge or a side edge of the field.

In the center point image storage section 304, the output of the decoder 350 represents a back-to-center distance measured along a 45° line. Accordingly, the distance from one point on that 45° line to an adjacent point preceding it, is not a full line of picture elements but is one less than a full line of picture elements, i.e., 257 picture elements. This is the reason that the shift registers 360a–360o have 257 picture elements rather than 258. The final shift register delay 354 is thirty bits long, in order to synchronize the output on line 82 with the outputs of the other scan analysis sections.

The other 45° scan analysis section, illustrated in FIG. 9, differs from the right/left scan analysis section of FIG. 7 only in that its accumulator 406 has 259 bits in each of its shift registers, and its shift registers 460a–460o also have 259 bits each. In the accumulator section 400, the effect of using 259-bit shift registers in the accumulator 406 is to accumulate strings of unbroken ones along a 45° direction at right angles to the first 45° direction considered in relation to FIG. 8. By way of example, if an accumulated value is incremented at row position #8 during the analysis of a particular line, and then returned to the accumulator 406, it will be not returned to the binary adder 408 until one line plus one picture element position later. Consequently, an accumulated count will be kept for line #1 row #8, line #2 row #9, and so on, scanning across the required 45° direction. The reason for having 259 bits in the shift registers 460a–460o should also be apparent, since the distance between adjacent elements on the 45° scan line is one line plus one picture element position.

In the second 45° shift analysis section illustrated in FIG. 9 there is no additional delay element corresponding to the delay element 354 in the first 45° analysis section. This is because the second 45° analysis section has the longest inherent time delay of the four scan analysis sections. If a line is considered to have 258 picture elements, the time delay caused by the FIG. 9 center point image storage section 404 is fifteen lines plus fifteen picture elements. The time delay caused by the shift registers 360 in the center point image storage section 304 is fifteen lines minus fifteen picture elements. Hence, thirty picture elements are added in the delay 354 to synchronize the two 45° scan analysis sections. Similarly, it will be seen from FIG. 7 that the total time delay in the right/left scan analysis section is fifteen lines plus fifteen picture elements, as in the total delay in the up/down analysis section shown in FIG. 6.

Application to Wire Bonding Machine

Figure 10:
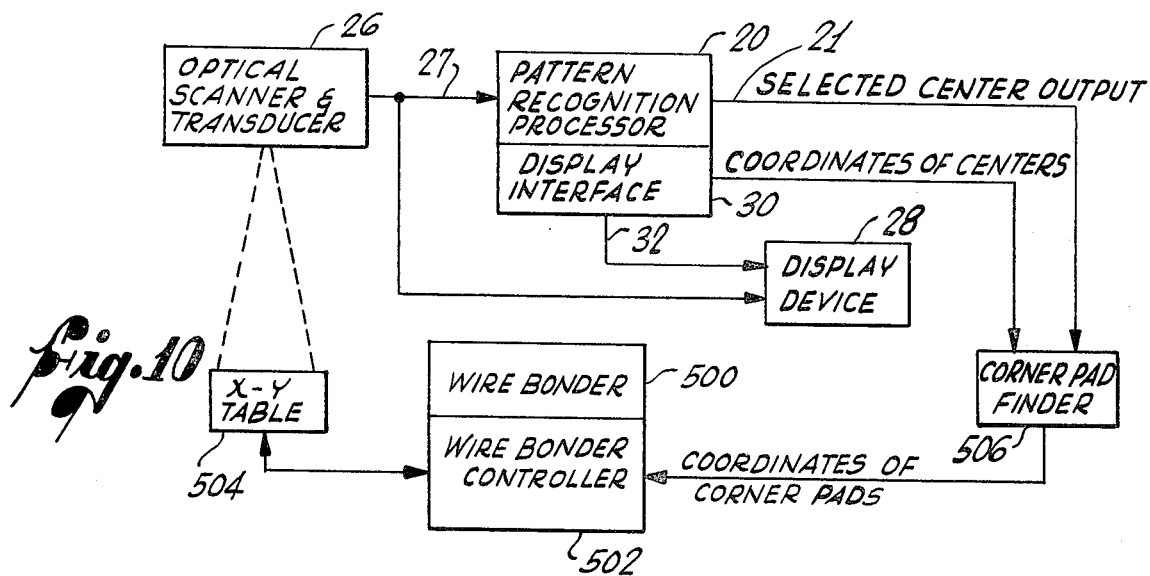
FIG. 10 is a block diagram of a wire bonder system utilizing the pattern recognition processor of the invention.

As shown in the block diagram of FIG. 10, the pattern recognition processor 20 may be readily applied to a wire bonder 500 having a controller 502 and an associated x-y table 504 positioned for scanning by the optical scanner and transducer 26. From the foregoing description of the pattern recognition processor 20, it will be appreciated that the output of the processor on line 21 is a serial data signal mapping the centers of distinguishable areas or blobs of a selected size range. It happens that the most easily distinguishable features of integrated circuit chips are the metallic bonding pads by means of which the chips are electrically connected to lead frames or to other related components.

The wire bonder 500 and its controller 502 are of a type which can perform a sequence of bonding operations automatically once the controller is provided with information relating to the position and orientation of the chip being processed.

The bonder 500 can be any conventional machine, such as the K & S Model 478/479, manufactured by Kulicke & Soffa Industries, Inc., of Horsham, Pa. The controller can be of the type manufacture by Industrial Micro Systems, Inc., of Orange, Calif., for use with the K & S bonder. In any event, the bonder 500 and controller 502 together comprise a machine operating on numerical control principles. Once this machine has been pre-programmed to perform a sequence of bonding operations on a particular type of chip, the only input information required is that which defines the precise position and orientation of each chip. This information can be provided in the form of the coordinates of two known reference points on the chip. For convenience, the reference points selected are the bonding pads closest to two selected corners of the chip, which is usually rectangular or square in shape.

Figure 11:
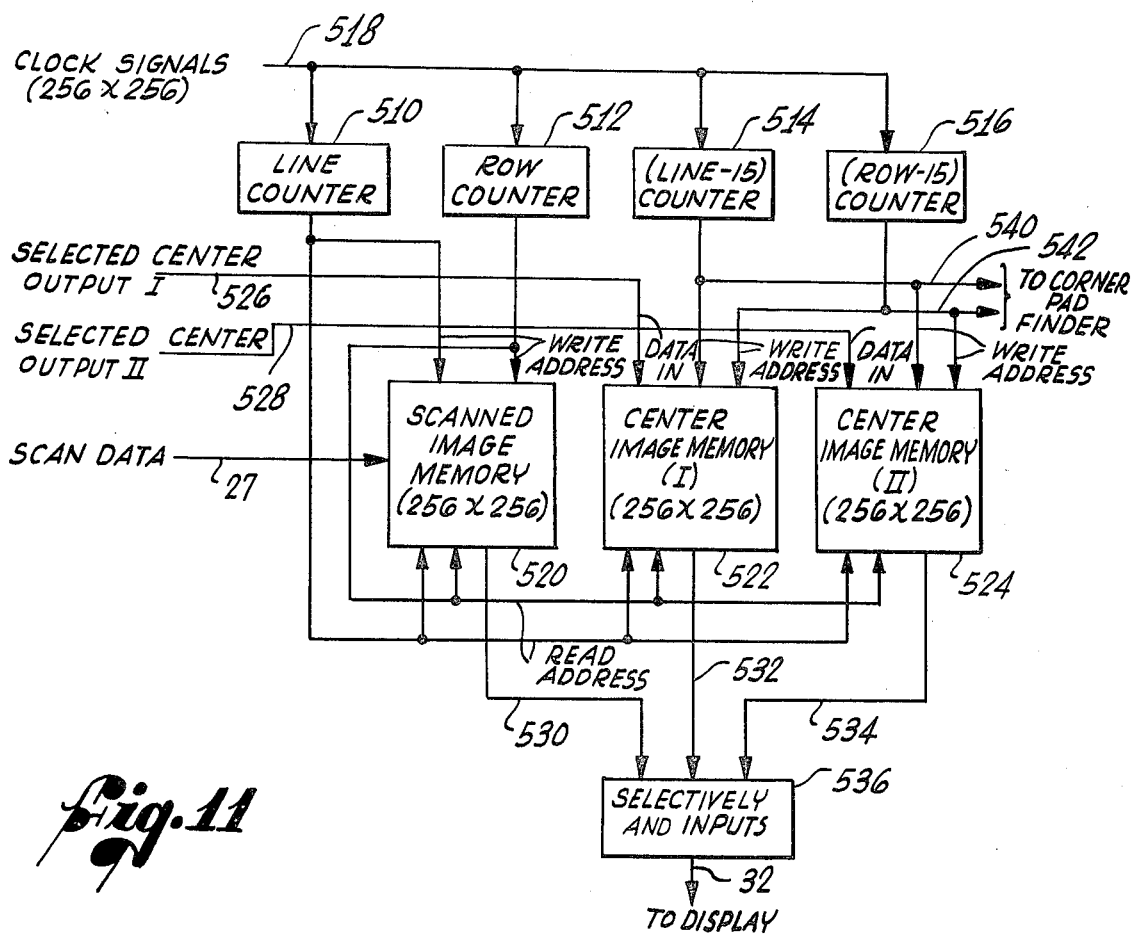
FIG. 11 is a simplified logic diagram of the display interface included in FIG. 10.
Figure 12:
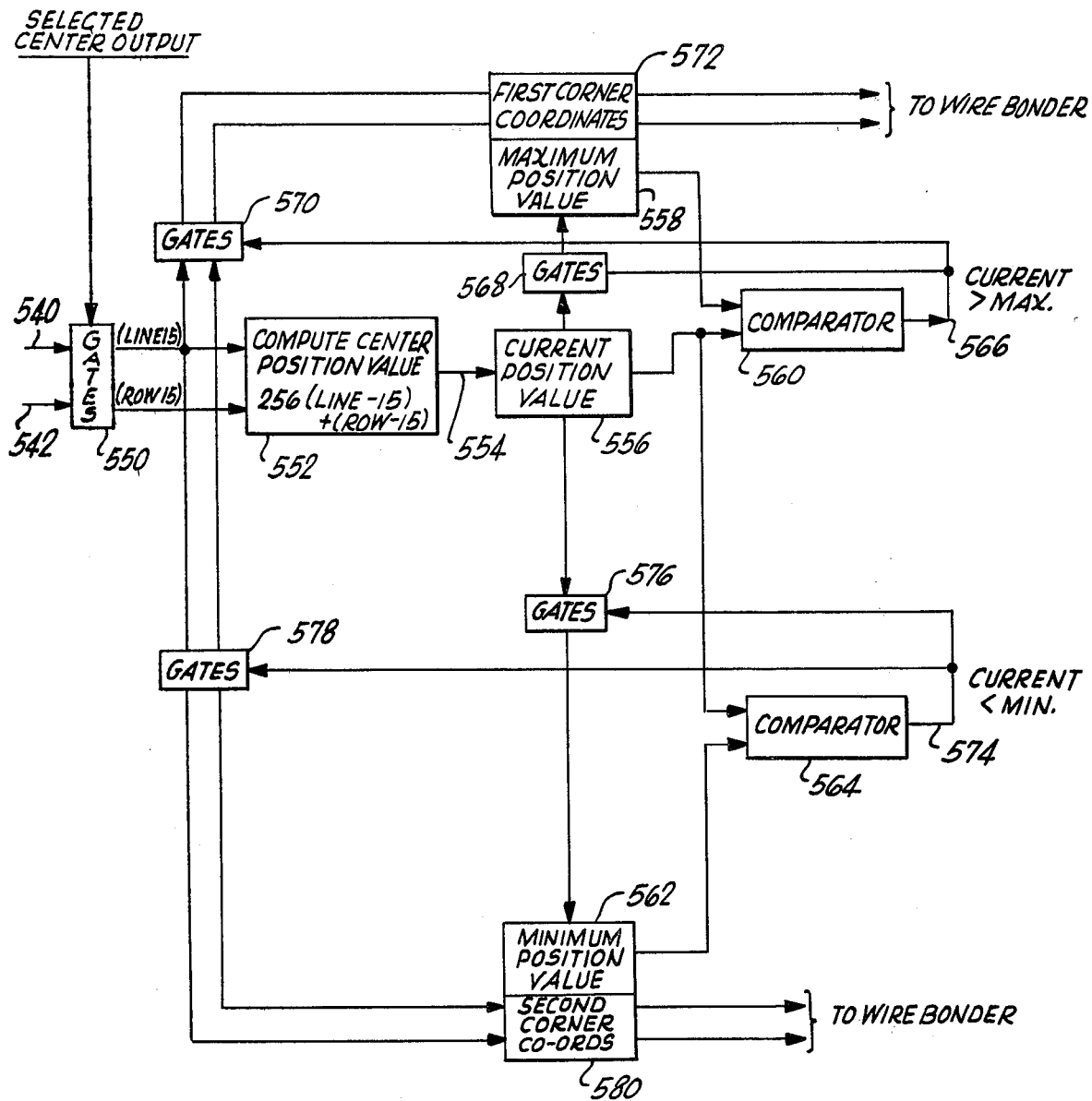
FIG. 12 is a simplified logic diagram of the corner pad finder included in FIG. 10.

Accordingly, an additional processing step is required, to select from the centers of the bonding pads identified in the signal on line 21 from the pattern recognition processor 20, two centers relating to two selected corners of the chip. If the chip is known to be oriented with one pair of edges parallel or nearly parallel to the optical scanning direction, two diagonally opposite corner pads can be located merely by selecting the first and last center points to appear in the output signal from the pattern recognition processor 20. If, however, the chip is not so precisely oriented, a corner pad finder 506 of a slightly more sophisticated nature may be required. In the present embodiment, the corner finder 506 illustrated in simplified form in FIG. 12 is used. Before it can be meaningfully described, however, the display interface 30, illustrated in detail in FIG. 11, must first be explained.

Maintained within the display interface 30, or elsewhere in the processor 20, are a line counter 510 a row counter 512 and a delayed line counter 514 and delayed row counter 516. It will be recalled that the output signal from the pattern recognition processor 20 is delayed from the original optical scanning signal output by a fixed delay of fifteen lines plus fifteen picture elements. The line counter 510 and row counter 512 determine the current line and row values in relation to the original optical scan. These counters are clocked by clock signals indicated as appearing on line 518, although it will be appreciated that these are different clock signals from the ones used in the pattern recognition processor 20. For purposes of explanation, the clock signals on line 518 may be considered to have 256 pulses per line rather than 258. The clock signals on line 518 are shown as connected to both the row counter and the line counter, although it will be appreciated that the clock signals for the line counter occur at a slower rate than the clock signals for the row counter.

The delayed line counter 514 and delayed row counter 516 are advanced in synchronism with the line counter 510 and row counter 512, but indicate counts which are fifteen less than the corresponding values in the line counter and row counter. It will be understood that counting is performed in module-256 fashion, i.e. if the row counter 510 indicates row #15, the delayed row counter will indicate row #256. The delayed counters 514 and 516 provide a time reference for the center point image storage information which is output from the pattern recognition processor 20.

The display interface 30 further comprises three separate memories: a scanned image memory 520, a center image memory 522 and a second center image memory 524. Each of these memories is a 256×256 matrix or array which can be addressed by aupplying appropriate line and row address coordinates. The data input for the scanned image memory 520 is derived from the optical scan data on line 27 (FIG. 10). The data inputs on the first and second center image memories 522 and 524 are derived respectively from first and second selected center outputs on lines 526 and 528. The write addresses for the scanned image memory 520 are obtained from the line counter 510 and row counter 512. Accordingly, the scanned image is stored in the scanned image memory 520.

The write addresses for the center image memories 522 and 524 are derived from the delayed line counter 514 and delayed row counter 516. The selected outputs on lines 526 and 528 are, therefore, transferred to their proper time-related locations in the memories 522 and 524. The read addresses for all of the memories 520, 522 and 524 are derived from the line counter 510 and the row counter 512, and outputs from the memories are obtained on lines 530, 532 and 534, respectively. The outputs are then selectively and'ed, as indicated at 536, and transmitted to the display over line 32. Depending upon the selections made at the AND gate 536, the scanned image memory 520 can be displayed with either or both of the center image memories 522 and 524. The selected outputs displayed may be the up/down and right/left center points and the 45° center points, or may be selected center lines of any of the four scan analysis sections. The delayed line counter 514 and delayed row counter 516 also provide outputs on lines 540 and 542, respectively, to be used in the corner finder 506 as further illustrated in FIG. 12.

If the currently selected center point output has a "one" value, indicating the occurrence of a center point, the coordinates of that center point on lines 540 and 542 are gated, as indicated by gates 550 to which the center selected output is applied, to an adder 552. The output of the adder 552 on line 554 represents the sum of the coordinates of a center point, and this will be referred to as the current position value, which is stored as shown at 556. If the lines and rows of a square matrix are numbered sequentially from one corner, it will be readily apparent that the sum of the coordinates of each point in the matrix has a minimum value at the corner in which numbering begins, and a maximum value at the diagonally opposite corner. Points in the matrix having equal position values lie on 45° lines, each at right angles to a line down between the two corners in question. It will therefore be apparent that the position value represents a convenient measurement parameter for determining which of the center points is closest to a particular corner. The current position value is compared with a maximum position value 558 in comparator 560, and with a minimum position value 562 in a comparator 564. If the current position value is greater than the maximum position value, a signal is generated by the comparator on line 566 to enable gates 568 and 570. This results in the current position value 556 being transferred to the maximum position value 558, and in the coordinate values on lines 540 and 542 being transferred to first corner coordinate storage locations 572. Similarly, if the current position value 556 is less than the minimum position value 562, the comparator 564 generates an output on line 574 which enables gates 576 and 578, to transfer the current position value to the minimum position value and to transfer the coordinate values on lines 540 and 542 to a second corner coordinate location 580. The locations 572 and 580 for the first and second corner coordinates are transferred to the wire bonder controller 502 so that the position and orientation of the chip on the x-y table 504 can be determined.

It will be appreciated from the foregoing description that the present invention represents a very important advance in the field of pattern recognition generally, as well as in fields relating to the manipulation of IC semiconductor chips. It will also be appreciated that, although the invention has been described in detail for purposes of illustration, various changes and modifications may be made without departing from the spirit and scope of the invention. Accordingly, the invention is not to be limited except as by the appended claims.

We claim:

1. A method for locating the centers of distinguishable areas falling within a selected size range in a field of interest, said method comprising the steps of:

scanning the field in a raster scan sequence of parallel lines oriented in a first scanning direction;

generating image signals indicative of portions of the parallel lines that overlap the distinguishable areas; and processing the image signals to obtain a centerline signal representative of the locus of center points of the portions of the parallel lines that overlap the distinguishable areas, said processing step also including disregarding image signals indicative of distinguishable areas falling outside a selected size range.

2. A method as set forth in claim 1, and further including the steps of:

scanning the field in a second raster scan sequence of parallel lines oriented in a second scanning direction;

generating a second set of image signals indicative of portions of the second set of parallel lines that overlap the distinguishable areas; and processing the second set of image signals to obtain a second center-line signal representative of the locus of center points of the portions of the second set of parallel lines that overlap the distinguishable areas, said step of processing the second set of image signals also including disregarding image signals indicative of distinguishable areas falling outside the selected size range.

3. A method as set forth in claim 2, and further including the step of logically combining the first and second center-line signals to determine a center point for each distinguishable area falling within the selected size range.

4. A method as set forth in claim 2, wherein the first and second scanning directions are substantially orthogonally related.

5. A method as set forth in claim 4, and further including the steps of:

scanning the field in third and fourth raster scan sequences of parallel lines oriented in third and fourth scanning directions, respectively;

generating third and fourth sets of image signals indicative of portions of the third and fourth sets of parallel lines that overlap the distinguishable areas;

processing the third and fourth sets of image signals to obtain third and fourth center-line signals representative of the loci of center points of the portions of the third and fourth sets of parallel lines that overlap distinguishable areas, said step of processing the third and fourth sets of image signals also including disregarding image signals indicative of distinguishable areas falling outside the selected size range; and logically combining selected ones of the first, second, third and fourth center lines to determine a center point of each distinguishable area, whereby selection of a logical combination of the third and fourth center lines will usually yield a true center point in instances in which the selection of a logical combination of the first and second center lines does not, because of the shape and orientation of the area.

6. For use with a wire bonding machine, a method for determining the locations of bonding pads on a microcircuit chip, the locations to be utilized as reference points to provide the wire bonding machine with the exact position and orientation of the chip, said method comprising the steps of:

transforming an image of the chip into a serial binary data stream by scanning the image line-by-line in raster fashion, the scan lines following a first scanning direction;

processing the serial binary data stream to determine the centers of all bonding pads on the chip;

generating a serial output signal, time-delayed with respect to the serial binary data stream, and indicative of the center points of the bonding pads; and selecting two bonding pad centers for use as reference points by the wire bonding machine;

and wherein said processing step includes the step of disregarding distinguishable areas on the chip which fall outside of a preselected size range, whereby the bonding pads can be distinguished from other features of the chip.

7. For use with a wire bonding machine, a method for determining the locations of bonding pads on a microcircuit chip, the locations to be utilized as reference points to provide the wire bonding machine with the exact position and orientation of the chip, said method comprising the steps of:

transforming an image of the chip into a serial binary data stream by scanning the image line-by-line in raster fashion, the scan lines following a first scanning direction;

processing the serial binary data stream to determine the centers of all bonding pads on the chip;

generating a serial output signal, time-delayed with respect to the serial binary data stream, and indicative of the center points of the bonding pads; and selecting two bonding pad centers for use as reference points by the wire bonding machine;

and wherein said processing step includes deriving a first set of center lines of the bonding pads, with respect to the first scanning direction, generating therefrom a first serial output signal indicative of the first set of center lines, deriving a second set of center lines of the bonding pads, with respect to a second scanning direction, generating therefrom a second serial output signal indicative of the second set of center lines, logically combining the first and second serial output signals to obtain the signal indicative of the center points of the pads, and disregarding distinguishable areas on the chip which fall outside of a preselected size range, whereby the bonding pads can be distinguished from other features of the chip.

8. A method as set forth in claim 7, wherein said processing step further includes:

deriving third and fourth sets of center lines of the bonding pads, with respect to third and fourth scanning directions angularly oriented to the first and second scanning directions;

generating third and fourth serial output signals indicative of the respective third and fourth sets of center lines; and logically combining the third and fourth serial output signals to provide an alternate determination of the center points of the bonding pads.

9. Apparatus for locating the centers of distinguishable areas falling within a selected size range in a field of interest, said apparatus comprising:

means for scanning the field of interest and generating signals indicative of the image of the field;

signal processing means for determining from the image signals the center points of portions of parallel lines oriented in a first scanning direction with respect to the field, said portions overlapping the distinguishable areas, the determined center points defining a first center line, with respect to the first scanning direction, for each distinguishable area, and said signal processing means including means for disregarding image signals corresponding to distinguishable areas falling outside a selected size range.

10. Apparatus as set forth in claim 9, and further including:

second signal processing means for determining from the image signals the center points of portions of parallel lines oriented in a second scanning direction with respect to the field, said portions overlapping the distinguishable areas, the determined center points defining a second center line, with respect to the second scanning direction, for each distinguishable area; and means for logically combining said first and second center lines to define a center point for each distinguishable area.

11. Apparatus as set forth in claim 10, wherein said first and second scanning directions are substantially orthogonally related.

12. Apparatus for determining the centers of a plurality of optically distinguishable areas in a two-dimensional field of view, said apparatus comprising:

means for transforming the field of view into a serial data stream representative of the field of view, including the plurality of optically distinguishable areas; and means for processing said serial data stream and deriving therefrom a serial output signal, time delayed with respect to said serial data stream, and containing information indicative of the center of each of the plurality of distinguishable areas falling within a preselected size range.

13. Apparatus as set forth in claim 12, wherein:

said serial data stream is obtained by scanning the field line-by-line in a first scanning direction; and said means for processing said serial data stream includes first processing means, for determining the position of a center line of each distinguishable area falling within the preselected size range, said centerline being derived by connecting the center points of portions of scan lines overlapping the optically distinguishable areas, and wherein said first processing means includes means for disregarding portions of scan lines not falling within the preselected size range.

14. Apparatus as set forth in claim 13, wherein said first processing means includes:

accumulator means for accumulating a count indicative of the width of a distinguishable area as scanned along a line in said first scanning direction;

means for determining from the accumulated count the center point of the distinguishable area with respect to a scan line in said first scanning direction; and means for storing center point images in said serial output signal.

15. Apparatus as set forth in claim 14, wherein said first processing means further includes means for resetting said accumulator means on reaching the end of a scan line, thereby to distinguish between an area at the end of one scan line and an area at the beginning of the next.

16. Apparatus as set forth in claim 13, wherein said means for processing said serial data stream also includes second processing means operating on said serial data stream in parallel with said first processing means, for determining the position of a second center line for each distinguishable area falling within the preselected size range, said second center line being measured in relation to a second scanning direction.

17. Apparatus as set forth in claim 16, wherein said second scanning direction is perpendicular to said first scanning direction.

18. Apparatus as set forth in claim 16, wherein said second processing means includes:

accumulator means for accumulating counts indicative of the widths of distinguishable areas as scanned along lines in said second scanning direction;

means for determining from the accumulated counts the center points of portions of lines overlapping the distinguishable areas in said second scanning direction; and means for storing the center point images in a serial data output stream from said second processing means.

19. Apparatus as set forth in claim 18, wherein said first processing means includes:

accumulator means for accumulating counts indicative of the width of distinguishable areas as scanned along lines in said first scanning direction;

means for determining from the accumulated counts the center points of the distinguishable areas with respect to scan lines in said first scanning direction; and means for storing the center point images in a serial data output stream from said first processing means;

and wherein said means for processing said serial data stream includes means for selectively combining said serial data output streams from said first and second processing means, to produce said serial output signal representative of intersections of center lines determined with respect to said first and second scanning directions.

20. Apparatus for determining the centers of optically distinguishable areas in a two-dimensional field of view, said apparatus comprising:

means for transforming the field of view into a serial binary data stream representative of the field of view as scanned along a sequence of lines in a first scanning direction;

first processing means for determining from said binary data stream the position of a first center line for each distinguishable area, said first center lines being measured in relation to said first scanning direction, and for generating a first serial output signal, time-delayed with respect to said binary data stream, and containing binary data indicative of said first center lines;

at least one additional processing means for determining from said binary data stream the position of at least one additional center line for each distinguishable area, said additional center lines being measured in relation to at least one additional scanning direction, and for generating at least one assitional serial output signal, time-delayed with respect to said binary data stream, and containing binary data indicative of said additional center lines;

means for selectively combining said first and additional serial output signals to yield a combined output signal indicative of the center points of the distinguishable areas; and filter means, included within said first and additional processing means, for disregarding distinguishable areas falling outside of a preselected size range.

21. Apparatus as set forth in claim 20, wherein: said first processing means includes first accumulator means for accumulating counts indicative of lengths of unbroken strings of bits of data representing the distinguishable areas, and means for storing in said first serial output signal data bits indicative of the centers of said unbroken strings, and therefore indicative of the centers of portions of lines overlapping the distinguishable areas in said first scanning direction; and said additional processing means includes a second processing means having second accumulator means for accumulating counts indicative of the lengths of unbroken strings, in a second scanning direction, of bits of data representing the distinguishable areas, and means for storing in a second serial output signal data bits indicative of the centers of said unbroken strings, and therefore indicative of the centers of portions of lines overlapping the distinguishable areas in said second scanning direction.

22. Apparatus as set forth in claim 21, wherein: said first accumulator means includes an accumulator register, means for incrementing said register on the occurrence of a "1" in said binary data stream, and means for utilizing and resetting the contents of said register on the occurrence of a "0" in said binary data stream; and said means for storing in said first serial output stream includes means for dividing the count in said register by two to derive a binary value equivalent to the position of a center point measured from a current scanning position, and decoder means for transforming said binary value to an equivalent linear distance measured back along said first serial output stream.

23. Apparatus as set forth in claim 21, wherein: said second accumulator means includes a plurality of accumulator registers, one for each binary data element in a line of data in said first scanning direction, means for incrementing a selected one of said registers on the occurrence of a "1" in said binary data stream, whereby each of said registers accumulates a count of unbroken strings of "1" bits in said second scanning direction, and the selection of registers is changed sequentially in synchronism with the data rate of said binary data signal, in order to orient said second scanning direction perpendicular to said first scanning direction, and means for utilizing and resetting the contents of a selected register on the occurrence of a "0" in said binary data stream; and said means for storing in said second serial output stream includes means for dividing an accumulated count by two to derive a binary value equivalent to the position of a center point measured from a current scanning position back along said second scanning direction, decoder means for transforming said binary value to an equivalent linear distance value measured back along said second scanning direction, and means for converting said linear distance value to another linear distance value measured along said second output stream, in said first scanning direction.

24. Apparatus as set forth in claim 21, wherein said additional processing means further includes third and fourth processing means, respectively including:

third and fourth accumulator means for accumulating counts indicative of the lengths of unbroken strings, in third and fourth scanning directions, of bits of data representing the distinguishable areas; and means for storing in third and fourth serial output signals data bits indicative of the centers of said unbroken strings, and therefore indicative of the centers of portions of lines overlapping the distinguishable areas in said third and fourth scanning directions.

25. Apparatus as set forth in claim 24, wherein:

each of said second, third and fourth accumulator means includes a plurality of accumulator registers, there being at least as many as there are binary elements in a line of data in said first scanning direction, means for selecting said registers sequentially so that the same register is selected each time that a bit located on a particular line in the scanning direction enters said processing means, means for incrementing selected registers on the occurrence of a "1" in said binary data stream, and means for utilizing and resetting selected registers on the occurrence of a "0" in said binary data stream; and each of said means for storing in said second, third and fourth serial output signals respectively includes means for dividing an accumulated count by two to derive a binary value equivalent to the position of a center point measured from a current scanning position back along one of said second, third and fourth scanning directions, decoder means for transforming said binary value to an equivalent linear distance value measured back along one of said second third and fourth scanning directions, and means for converting said linear distance value to another linear distance value measured along one of said second, third and fourth serial output streams, in said first scanning direction.

26. For use with a wire bonding machine, apparatus for determining the locations of particular bonding pads on a microcircuit chip, the bonding pad locations to be utilized as reference points to provide the wire bonding machine with the exact position and orientation of the chip, said apparatus comprising:

means for transforming an image of the chip placed in a scanning field into a serial binary data stream in which bonding pad areas on the chip are identified as having a particular binary state, said serial binary data stream resulting from scanning the image in raster fashion in a first scanning direction;

processing means for determining from said serial binary data stream the centers of all bonding pads on the chip, and for generating a serial output signal, time-delayed with respect to said serial binary data stream, and indicative of the center points of the bonding pads; and means for selecting the centers of at least two particular bonding pads, the coordinates of which can be supplied to the wire bonding machine, to define the exact position and orientation of the chip;

and wherein said processing means includes filter means for disregarding distinguishable areas on the chip which fall outside of a preselected size range, whereby bonding pads can be distinguished from other features of the chip.

27. Apparatus for locating the centers of distinguishable areas falling within a selected size range in a field of interest, said apparatus comprising:

means for scanning the field of interest and generating signals indicative of the image of the field;

means for determining from the image signals the center points of portions of parallel lines oriented in a first scanning direction with respect to the field, said portions overlapping the distinguishable areas, the determined center points defining a first center line, with respect to the first scanning direction, for each distinguishable area;

means for determining from the image signals the center points of portions of parallel lines oriented in a second scanning direction with respect to the field, said first and second scanning directions being substantially orthogonally related, said portions overlapping the distinguishable areas, and the determined center points defining a second center line, with respect to the second scanning direction, for each distinguishable area;

means for logically combining said first and second center lines to define a center point for each distinguishable area;

means for determining from the image signals the center points of portions of parallel lines oriented in a third scanning direction with respect to the field, said portions overlapping the distinguishable areas, the determined center points defining a third center line, with respect to said third scanning direction, for each distinguishable area;

means for determining from the image signals the center points of portions of parallel lines oriented in a fourth scanning direction with respect to the field, said portions overlapping the distinguishable areas, the determined center points defining a fourth center line, with respect to said fourth scanning direction, for each distinguishable area; and means for logically combining said third and fourth center lines to define a center point for each distinguishable area;

said third and fourth scanning directions also being substantially orthogonally related;

whereby the center points of most areas can be determined by employing the logical combination of either said first and second center lines of said third and fourth center lines.

28. Apparatus as set forth in claim 27, wherein said third and fourth scanning directions are oriented at approximately 45° to said first and second scanning directions.

29. Apparatus for determining the centers of optically distinguishable areas in a two-dimensional field of view, said apparatus comprising:

means for transforming the field of view into a serial data stream representative of the field of view, including the optically distinguishable areas; and means for processing said serial data stream and deriving therefrom a serial output signal, time delayed with respect to said serial data stream, and containing information indicative of the center of each distinguishable area falling within a preselected size range; and wherein said serial data stream is obtained by scanning the field line-by-line in a first scanning direction, said means for processing said serial data stream includes first processing means, for determining the position of a center line of each distinguishable area falling within the preselected size range, said center line being measured in relation to said first scanning direction, and said first processing means includes accumulator means for accumulating a count indicative of the width of a distinguishable area as scanned along a line in said first scanning direction, means for determining from the accumulated count the center point of the distinguishable area with respect to a scan line in said first scanning direction, means for storing center point images in said serial output signal, and filter means, for disregarding accumulated counts falling outside of selectable upper and lower limits.

30. Apparatus for determining the centers of optically distinguishable areas in a two-dimensional field of view, said apparatus comprising:

means for transforming the field of view into a serial data stream representative of the field of view, including the optically distinguishable areas; and means for processing said serial data stream and deriving therefrom a serial output signal, time delayed with respect to said serial data stream, and containing information indicative of the center of each distinguishable area falling within a preselected size range;

wherein said serial data stream is obtained by scanning the field line-by-line in a first scanning direction;

and wherein said means for processing said serial data stream includes first processing means, for determining the position of a center line of each distinguishable area falling within the preselected size range, said center line being measured in relation to said first scanning direction, second processing means operating on said serial data stream in parallel with said first processing means, for determining the position of a second center line for each distinguishable area falling within the preselected size range, said second center line being measured in relation to a second scanning direction, third and fourth processing means operating on said serial data stream in parallel with said first and second processing means, for determining the positions of third and fourth center lines for each distinguishable area falling within the preselected size range, said third and fourth center lines being measured in relation to third and fourth scanning directions, respectively, and means for selectively combining outputs from said first, second, third and fourth processing means to determine center points of the distinguishable areas.

31. Apparatus as set forth in claim 30, wherein said third and fourth scanning directions are orthogonally related and are oriented at 45° to said first and second scanning directions.

32. For use with a wire bonding machine, apparatus for determining the locations of particular bonding pads on a microcircuit chip, the bonding pad locations to be utilized as reference points to provide the wire bonding machine with the exact position and orientation of the chip, said apparatus comprising:

means for transforming an image of the chip placed in a scanning field into a serial binary data stream in which bonding pad areas on the chip are identified as having a particular binary state, said serial binary data stream resulting from scanning the image in raster fashion in a first scanning direction;

processing means for determining from said serial binary data stream the centers of all bonding pads on the chip, and for generating a serial output signal, time-delayed with respect to said serial binary data stream, and indicative of the center points of the bonding pads; and means for selecting the centers of at least two particular bonding pads, the coordinates of which can be supplied to the wire bonding machine, to define the exact position and orientation of the chip;

and wherein said processing means includes first processing means for deriving a first set of center lines of the bonding pads, said first set of center lines being determined with respect to said first scanning direction, and for generating a first serial output signal indicative of said first set of center lines, second processing means for deriving a second set of center lines of the bonding pads, said second set of center lines being determined with respect to a second scanning direction orthogonally related with said first scanning direction, and for generating a second serial output signal indicative of said second set of center lines, means for logically combining said first and second serial output signals to derive said serial output signal indicative of the center points of the pads, and filter means for disregarding distinguishable areas on the chip which fall outside of a preselected size range, whereby bonding pads can be distinguished from other features of the chip. pg,96

33. Apparatus as set forth in claim 32 wherein said processing means further includes:

third and fourth processing means for deriving third and fourth sets of center lines of the bonding pads, with respect to third and fourth respective scanning directions angularly oriented with respect to said first and second scanning directions, and for generating third and fourth serial output signals indicative of said respective third and fourth sets of center lines; and means for logically combining said third and fourth serial output signals to provide an alternate determination of the center points of the bonding pads.

* * * * *

UNITED STATES PATENT AND TRADEMARK OFFICE
CERTIFICATE OF CORRECTION

PATENT NO. : 4,163,212
DATED : July 31, 1979
INVENTOR(S) : WALTER R. BUERGER, KENNETH K. DIXON and JACQUES F. MONIER It is certified that error appears in the above-identified patent and that said Letters Patent are hereby corrected as shown below:

Column 4, line 23, delete "the" (first occurrence).

Column 5, line 25, "acount" should be --account--.

Column 8, line 54, "discription" should be --description--.

Column 13, line 8, "these" should be --there--;
line 49, "220" should be --200--.

Column 14, line 61, "acquivalent" should be --equivalent--.

Column 17, line 56, "aupplying" should be --supplying--.

Column 22, line 68, "assitional" should be --additional--.

Column 23, line 33, "said ..." should start a new paragraph;
line 50, "said ..." should start a new paragraph.

Column 25, line 63, "of" should be --or--.

Column 28, line 19, delete "pg,96".

Signed and Sealed this

Eighteenth Day of March 1980

[SEAL]

Attest:

SIDNEY A. DIAMOND

Attesting Officer    Commissioner of Patents and Trademarks